United States Patent
Shahidi

(10) Patent No.: US 8,896,118 B2
(45) Date of Patent: Nov. 25, 2014

(54) ELECTRONIC ASSEMBLY WITH COPPER PILLAR ATTACH SUBSTRATE

(71) Applicant: Texas Instruments Incorporated, Dallas, TX (US)

(72) Inventor: Nima Shahidi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 13/798,678

(22) Filed: Mar. 13, 2013

(65) Prior Publication Data
US 2014/0264829 A1    Sep. 18, 2014

(51) Int. Cl.
| H01L 23/48 | (2006.01) |
| H01L 21/44 | (2006.01) |
| H01L 23/498 | (2006.01) |
| H01L 21/48 | (2006.01) |

(52) U.S. Cl.
CPC ...... *H01L 23/49811* (2013.01); *H01L 21/4853* (2013.01)
USPC .......... 257/737; 257/738; 257/E23.021; 257/E23.069; 438/612; 438/613; 438/614

(58) Field of Classification Search
USPC .......... 257/737, 738, E23.021, E23.069; 438/612–617; 228/180.22
See application file for complete search history.

(56) References Cited

U.S. PATENT DOCUMENTS

| 6,784,554 | B2 * | 8/2004 | Kajiwara et al. | 257/778 |
| 7,749,888 | B2 * | 7/2010 | Nishiyama et al. | 438/612 |
| 7,851,345 | B2 * | 12/2010 | Shim et al. | 438/612 |
| 8,586,467 | B2 * | 11/2013 | Suzuki et al. | 438/613 |
| 2007/0170586 | A1 * | 7/2007 | Lee et al. | 257/737 |
| 2011/0149452 | A1 | 6/2011 | Whitefield et al. | |
| 2011/0260316 | A1 | 10/2011 | Jang et al. | |

OTHER PUBLICATIONS

Fine Pitch Copper Pillar Flip Chip. Technology Solutions. Amkor Technology Rev Date: Jun. 2010 [online]. Retrieved from the Internet: <URL: http: http://www.amkor.com/go/Copper-Pillar-Flip-Chip>, p. 1-3.
PCT, International Search Report, mailed Jul. 10, 2014.

* cited by examiner

*Primary Examiner* — Jasmine Clark
(74) *Attorney, Agent, or Firm* — Steven A. Shaw; Frederick J. Telecky, Jr.

(57) ABSTRACT

An electronic assembly includes a copper pillar attach substrate that has a dielectric layer and a solder resist layer overlying the dielectric layer. The solder resist layer has a plurality of solder resist openings. A plurality of parallel traces are formed on the dielectric layer. Each trace has a first end portion, a second end portion and an intermediate portion. The first and second end portions of each trace are covered by the solder resist layer and the intermediate portions are positioned in the solder resist openings. Each of the intermediate portions has at least one conductive coating layer on it and has a height measured from the dielectric layer to the top of the topmost conductive coating layer that is at least as great as the solder resist layer thickness.

20 Claims, 5 Drawing Sheets

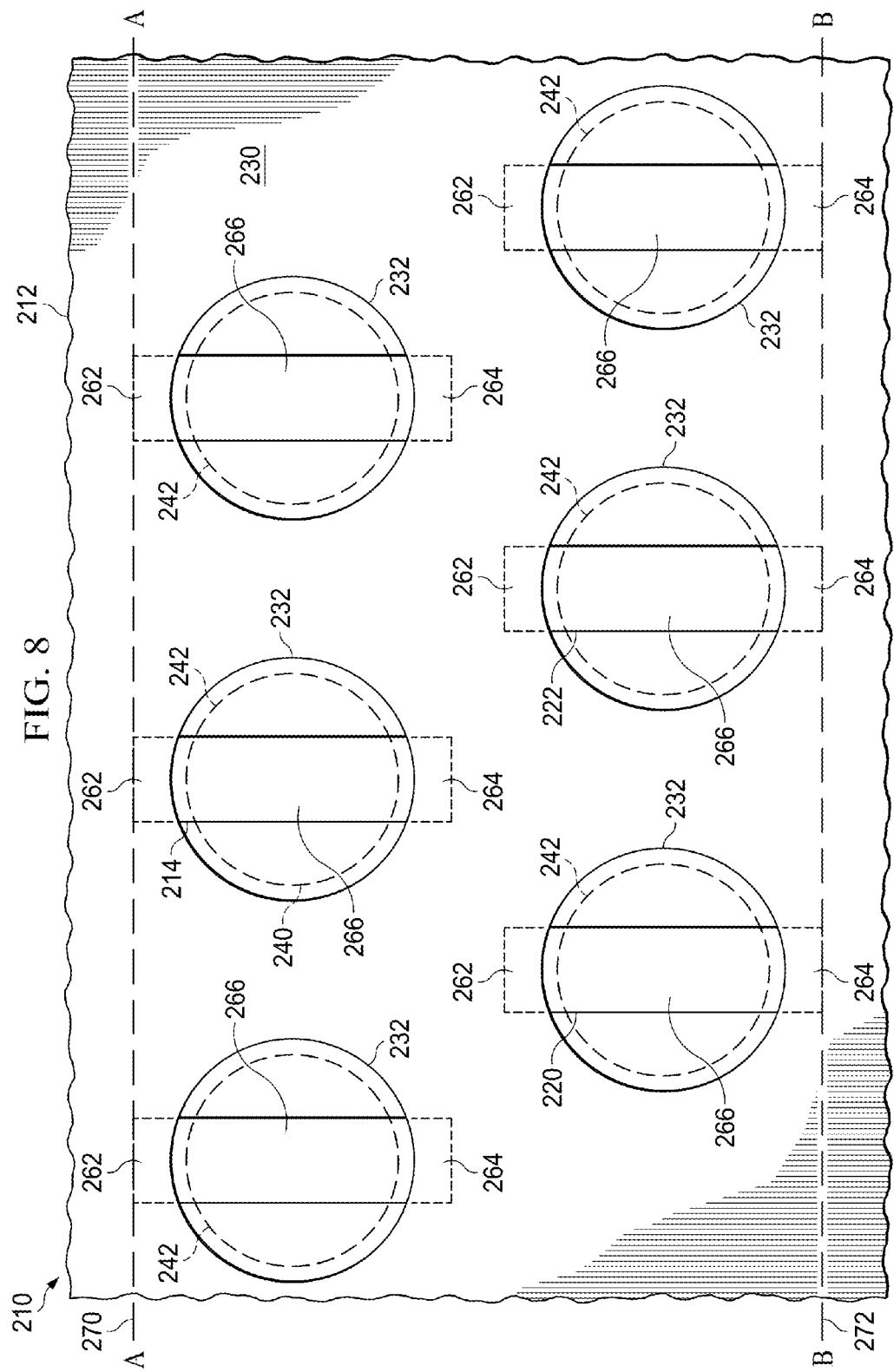

ELECTRONIC ASSEMBLY WITH COPPER PILLAR ATTACH SUBSTRATE

BACKGROUND

During the past decade flipchip technology has emerged as a popular alternative to wire bonding for interconnecting semiconductor devices such as integrated circuit (IC) dies to substrates such as printed circuit boards, carrier substrates, interposers and other dies.

"Flipchip," is also known as "controlled collapse chip connection" or its acronym, "C4." With flipchip technology, solder bumps are attached to electrical contact pads on one face of a die/chip. The flipchip dies are usually processed at the wafer level, i.e., while multiple identical dies are still part of a large "wafer." Solder bumps are deposited by an electroplating process on chip pads on the top side of the wafer and then reflowed to form a bump. The water is sometimes "singulated" or "diced" (cut up into separate dies) at this point to provide a number of separate flipchip dies each having solder bumps on the top face surface. the chips may then be "flipped" over to connect the solder bumps to matching contact pads on the top surface of a substrate such as a printed circuit board or carrier substrate on which the flipchip is mounted. Solder bump attachment is usually provided by reflow heating.

As IC dies have become more complex, the number of solder bumps on flipchips have increased dramatically. Whereas in the past the solder bumps were usually provided by relatively large round solder bumps attached to the chip contact pads, more recently copper pillars ("CuP's") have been used in place of the solder bumps. A CuP is an elongated copper post member that is attached at one end to a contact pad on the flipchip die. The CuP extends outwardly from the die in a direction perpendicular to the face of the die. Each CuP has a generally bullet or hemisphere shaped solder piece attached to its distal end. The CuP's are bonded by this solder piece to corresponding contact pads on a substrate as by reflow heating. CuP's are capable of being positioned much more densely, i.e., at a "higher pitch," than conventional solder bumps. For example, a typical pitch for a flipchip solder bump array is 150 µm, whereas a typical pitch for a flipchip CuP array is 40 µm. One manner of facilitating connection of a substrate to a die having such high CuP density is to provide bond "traces" (also referred to as "fingers"), rather than conventional contact pads, on the substrate to which the flipchip is to be mounted. The traces are elongated contact pads that may be positioned in close parallel relationship, traditionally without any insulating material between them.

BRIEF DESCRIPTION OF THE DRAWINGS

FIG. 8 is a top plan view of a flipchip die mounted on a substrate as shown in FIG. 7, with the entire flipchip die, except for cross sectional portions of the copper pillars, cut away.

DETAILED DESCRIPTION

Figure 6:
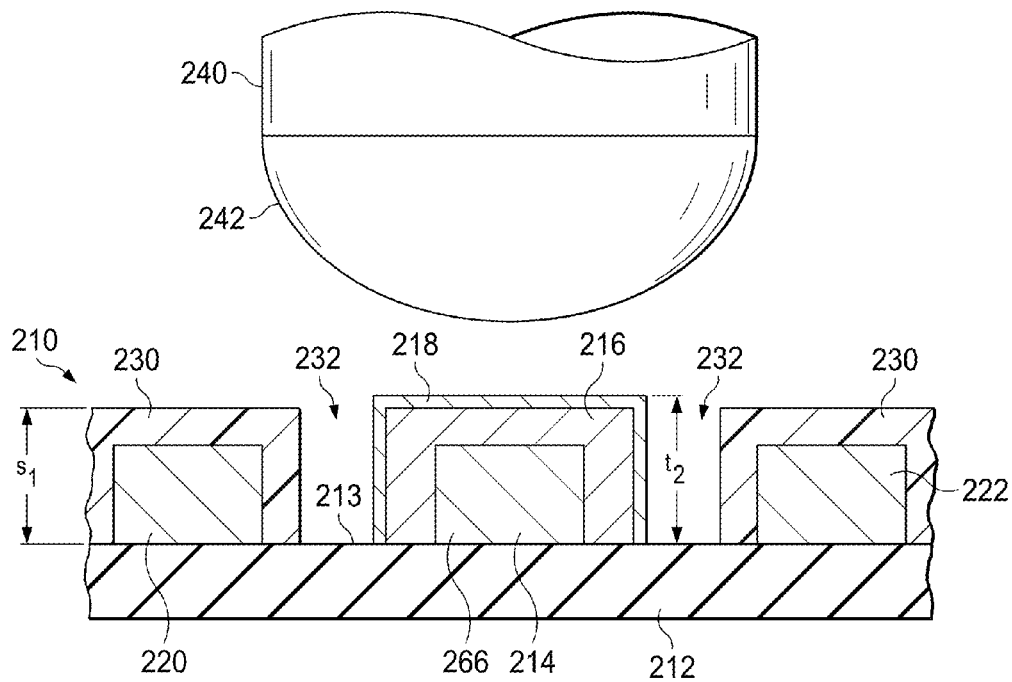
FIG. 6 is a cross sectional elevation view of another substrate to which a flipchip die of the type shown in FIGS. 1 and 2 may be connected.
Figure 7:
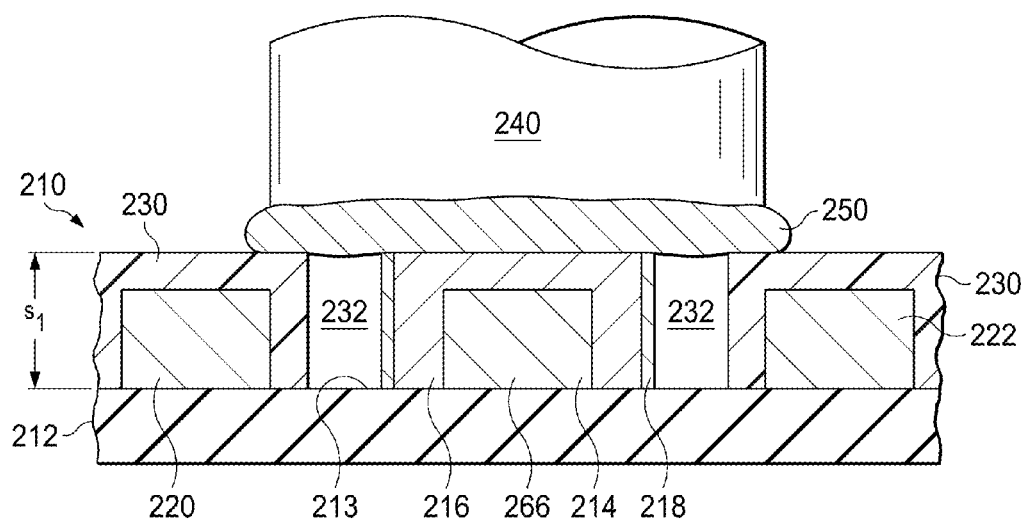
FIG. 7 is a cross sectional elevation view of a substrate, such as shown in FIG. 6, attached to a flipchip die, such as shown in FIG. 1 and 2.

This specification, in general, as best shown in FIGS. 6-8, discloses an electronic assembly that includes a CuP attach substrate 210 that has a dielectric layer 212 and a solder resist layer 230 overlying the dielectric layer 212. The solder resist layer 230 has a plurality of solder resist openings 232 in it. A plurality of parallel traces 214, 220, 222 are formed on the dielectric layer 212. Each trace has a first end portion 262, a second end portion 264 and an intermediate portion 266. The first and second end portions 262, 264 are covered by the solder resist layer 230. The intermediate portions 266 are positioned in the openings 232 in the solder resist layer 230. Each of the intermediate portions 266 has at least one conductive coating layer 216, 218 on it. The height of each intermediate portion 266 measured from the top surface 213 of the dielectric layer 212 to the top of the topmost conductive coating layer 218 is at least as great as the thickness of the solder resist layer 230.

Figure 1:
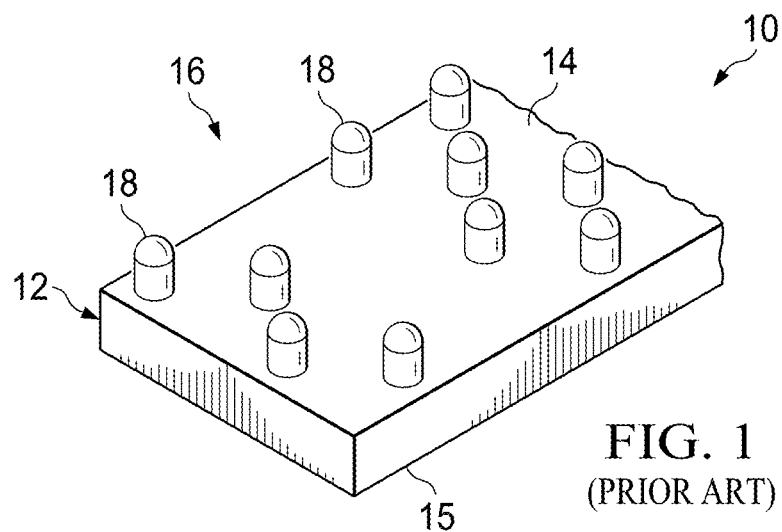
FIG. 1 is a top isometric view of a conventional flipchip die with copper pillars.

As illustrated by FIG. 1, a conventional flipchip die 10 comprises a semiconductor substrate 12 that contains internal circuitry. The substrate 12 has a first or active face 14 and a second or inactive face 15 opposite the first face 14. An array of copper pillars 16 project from the active face surface 14 of the die 10. The array of copper pillars 16 includes a number of individual copper pillars 18 which may be arranged in any desired configuration on the first face 14.

Figure 2:
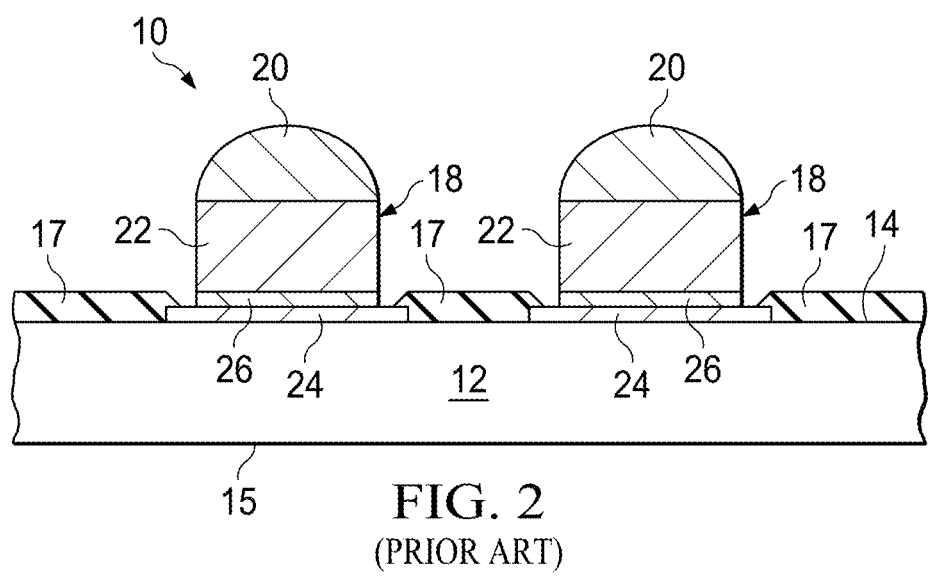
FIG. 2 is a detailed cross sectional view of a portion of the flipchip die of FIG. 1.

FIG. 2 illustrates a typical structure of a pair of conventional copper pillars 18 projecting from the first face 14 of the die 10. Each of the individual copper pillars 18 may comprise a generally bullet or hemisphere shaped solder tip portion 20 mounted on a generally cylindrical copper post portion 22. Each copper post portion 22 is mounted on a contact pad 24 that is formed at the top surface of the silicon substrate 12. The contact pad 24 is connected to internal circuitry (not shown) in the silicon substrate 12. The copper post portion 22 may be conventionally physically and electrically connected to the contact pad 24 as by under bump metal layer 26 in a manner well known in the art. Thus, each copper pillar 18 is electrically connected to internal circuitry in the semiconductor substrate 12 through the contact pad 24 and under bump metal layer 26. A passivation layer 17 on the first face 14 of the die 10 encompasses each copper pillar 18.

Figure 3:
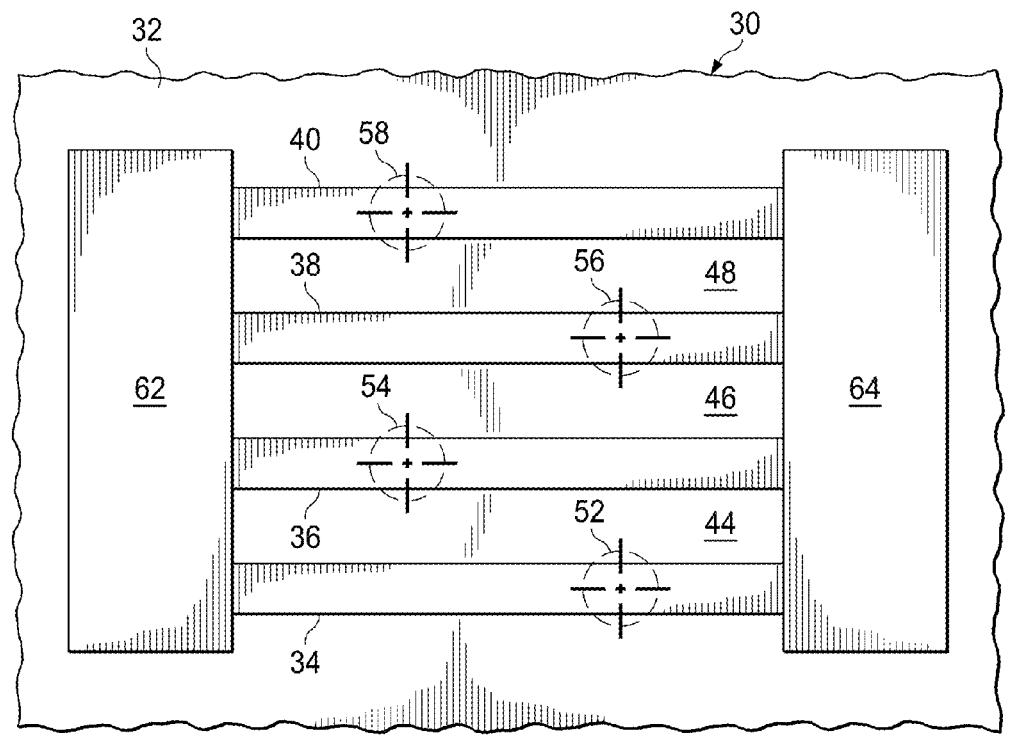
FIG. 3 is a top plan view of a portion of a conventional substrate to which a flipchip die of the type shown in FIGS. 1 and 2 may be connected.

FIG. 3 is a top plan view of a portion of a substrate 30 which is adapted to be connected to some of the copper pillars ("CuP's") 18 of the flipchip die 10. The substrate 30 may be a printed circuit board, IC package carrier board, interposer, or other type of electrical connection substrate. The substrate 30 has a top surface 32 upon which a plurality of generally parallel traces (sometimes referred to herein simply as "traces") 34, 36, 38, 40 are provided by use of conventional or other methods. The traces 34, 36, 38, 40 may be made of copper or another conductive metal. The traces 34, 36, 38, 40 may be coated with other material such as tin or silver to facilitate bonding with the solder tips of copper pillars. The traces 34, 36, 38, 40 are separated by spaces 44, 46, 48 which may all be of the same width. The traces 34, 36, 38, 40 may also be of the same width. A typical width range for the prior art traces 34, etc., is 15 μm to 20 μm. The spaces 44, 46, 48 between traces may have a typical width range of 40 μm to 80 μm. The ratio of the width of a trace to the width of the space between them is typically about 2.5 to 4. The positions at which the solder tip portions 20 of associated CuP's 18 are connected to individual traces 34, 36, 38, 40 are illustrated by dashed circles and cross hairs at 52, 54, 56, 58. Opposite longitudinal ends of the traces 34, 36, etc., are covered, respectively, with strips 62, 64 of solder resist. Solder resist is a nonconductive material used to shield conductive pads and traces from solder or other conductive material. Solder resist is sometimes referred to in the art as "solder mask." A typical width (a direction parallel to the direction in which the traces extend) range of a solder resist strip provided over an end portion of a trace is about 70 μm to 170 μm.

Figure 4:
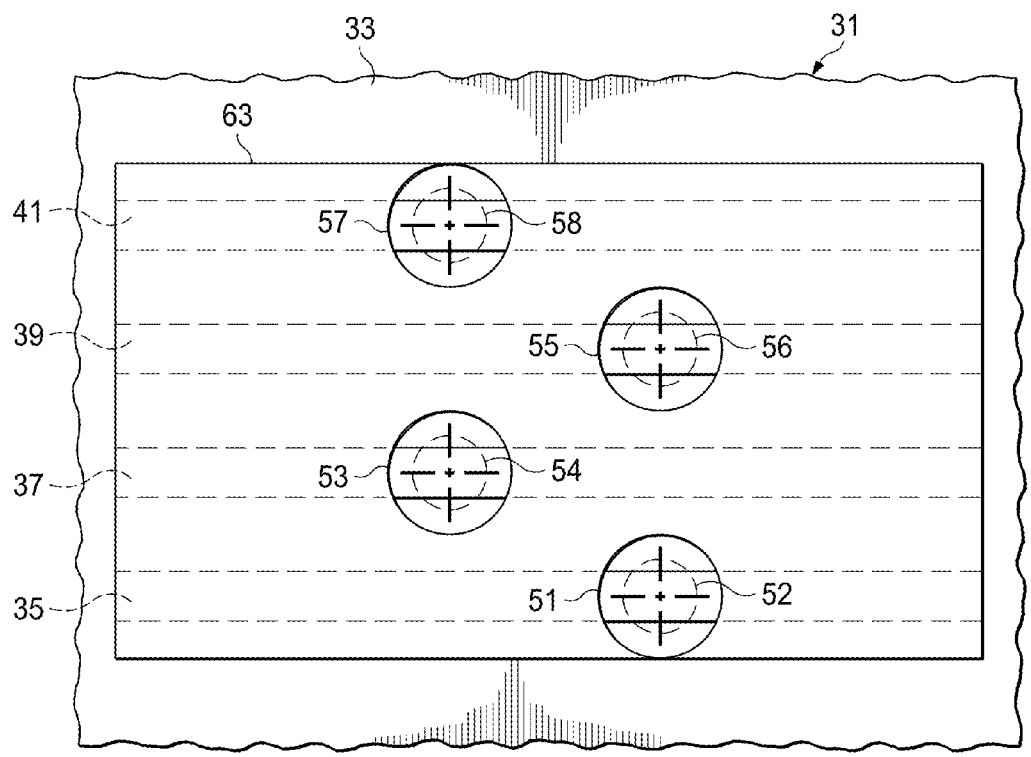
FIG. 4 is a top plan view of a portion of another type of substrate to which a flipchip die of the type shown in FIGS. 1 and 2 may be connected.

FIG. 4 is a top plan view of a portion of a substrate 31 which, like the substrate 30 of FIG. 3, is adapted to be connected to some of the copper pillars ("CuP's") 18 of the flipchip die 10. The semiconductor substrate 31 has parallel, spaced apart traces or "fingers" 35, 37, 39, 41 formed on a top surface 33 thereof. The structure of the substrate 31 is similar to that of substrate 30, except that a layer of solder resist completely covers the traces 35, 37, 39, 41 except for a small solder resist opening over each trace. A layer of solder resist 63 covers all of the traces between the opposite ends thereof, except for small solder resist openings 51, 53, 55, 57 provided above an intermediate portion of each trace 35, 37, 39, 41. The openings 51, 53, 55, 57 are somewhat larger than the width of each trace and are provided in staggered relationship. The openings 51, 53, 55, 57 are also wider than the diameter of CuP's 52, 54, 56, 58, which are bonded to portions of corresponding traces that are exposed by the openings 51, 53, 55, 57.

Figure 5:
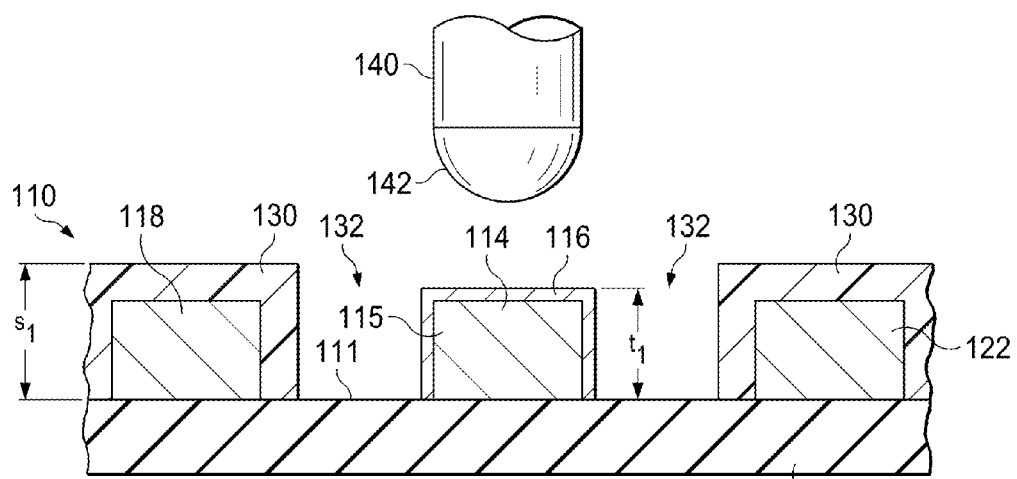
FIG. 5 is a cross sectional view of another substrate of the type shown in FIG. 4.

FIG. 5 is a cross sectional elevation view of a substrate 110 having a structure substantially identical to that of substrate 31 shown in FIG. 4. Substrate 110 has a dielectric layer 112. A first trace 114 is formed on a top surface 111 of the dielectric layer 112. The trace 114 may be a copper trace or may be formed from another suitable conductor such as gold. As shown in FIG. 5, a conductive coating 116 that is readily bondable with solder, for example tin or silver, covers the top and side surfaces of a portion of trace 114. The portion of the first trace 114 to which the coating 116 is applied is positioned within a solder resist opening 132. A second trace 118 is positioned adjacent to one side of the first trace 114 and a third trace 122 is positioned adjacent to the other side of the first trace 114. A solder resist layer 130 covers all of the traces 114, 118, 122, except in the area of a solder resist opening above an intermediate portion of each trace, such as solder resist opening 132 positioned over an intermediate portion 115 of first trace 114. The solder resist openings are staggered such as the solder resist openings 51, 53, 55, 57 shown in FIG. 4. Thus, in FIG. 5, there is no opening over second and third traces 118 and 122 at a location thereon adjacent to the opening 132 over first trace 114. Solder resist 130 covers both the top and side portions of traces 118 and 122 adjacent to an intermediate portion 115 of trace 114 that lies in the solder resist opening 132. The height "$s_1$" of the solder resist layer 130 above the substrate surface 111 at the opening 132 is greater than the height "$t_1$" from the substrate surface 111 to the top of the conductive coating layer 116 on the first trace 114. A CuP 140 having a solder tip 142 is positioned directly above trace 114 intermediate portion 115 and may be bonded to trace 114 by moving it downwardly into contact with the coating 116 and then reflowing solder tip 142 and coating 116. The bonding of the tip of a CuP to a coated trace is known in the art and is thus not further described herein.

Applicant has discovered certain problems associated with flipchip die mount substrates such as described with reference to FIGS. 4 and 5 above. One problem is that the manufacturing tolerances for such substrates are very small and deviation from these tolerances may cause the flipchip/substrate assembly to fail in several different ways. For example, if the solder resist layer 130 is shifted on the dielectric layer 112 a small distance to the left from the position shown in FIG. 5, a portion of the third trace 118 may become exposed and any solder from the solder tip 142 of the CuP 140 that may run into the solder resist opening 132 during reflow may cause traces 114 and 118 to short. The same shift to the left may cause the portion of the opening 132 between trace 114 and trace 122 to be reduced so much that the CuP 140 will be prevented by the solder resist 130 around trace 122 from moving freely into contacting relationship with the tip of trace 114. As the CuP 140 descends it may shave off a portion of the solder resist 130 around trace 122 with the shaved off portion of solder resist falling onto the coating layer 116 and interfering with the bond between the solder tip 142 and the coating layer 116. Making the solder resist opening 132 too small causes a similar problem and results in solder resist residue falling onto the coating layer 116 of the trace 122 in the area of the solder resist opening 132. Also, reducing the opening size of the solder resist increases the risk of not making a good contact between the CuP tip 142 and the trace 114. To prevent such problems from arising, the size of the solder resist opening 132 may be increased. However increasing the size of the solder resist opening 132, may result in a different failure mode, referred to as "solder resist undercut." Undercut frequently happens when the width of the solder resist covering on an adjacent trace, such as 118 or 122 decreases. Optimizing the process that produces solder resist openings so that the solder resist openings are not too large and not too small is very costly. The below described structures and processes may be used to obviate problems such as described above.

FIG. 6 is a side elevation view of a semiconductor substrate 210 having a dielectric layer 212 with a top surface 213. A first trace 214 is formed on surface 213. The first trace 214 may be copper, gold or other suitable conductor. The first trace 214 has an intermediate portion 266 of its length that is positioned within a solder resist opening 232 of a solder resist layer 230. A first conductive coating layer 216 covers the intermediate portion 266 of the first trace 214. This layer 216 is formed from a conductive material such as copper with a melting temperature that is sufficiently high that it does not melt during reflow heating as further described below. Alternatively, nickel can be deposited on 214 by an electroless or electroylic plating process. In one embodiment coating layer 216 raises one conductive surface covering the trace 214 to about the same height as the solder resist layer 230. A second coating layer 218 may be applied over the first coating layer 216 on the first trace 214 in the intermediate portion 266 thereof. Both coating layers 216, 218 are conductive coating layers. The second coating layer may raise the conductive surfaces covering the trace 214 to an elevation above the solder resist layer 230. The first coating layer 216 may have a composition similar to the trace 214, for example both the trace 214 and the first coating layer 216 may be copper. The first coating layer 216 in one embodiment is thicker than the second coating layer 218. The first coating layer 216 may be selected from materials that adhere well to the trace 214 and which do not melt at reflow temperatures. The second coating layer may 218 may be selected from conductor materials that adhere well to the first coating layer 216, that bond well to solder, and that melt at reflow temperatures. For example, the second layer 218 could be tin or silver or an appropriate alloy. The layers 216, 218 may be applied to the intermediate portion 266 after the formation of the solder resist opening 232 by conventional means. A second trace 220 is positioned parallel and adjacent to one side of the first trace 214. A third trace 222 is positioned parallel and adjacent to the other side of the first trace 214. The combined thickness of the trace 214 and the second and third layers 216, 218, "$t_2$," is greater than the height, "$s_1$," of the solder resist layer 230 at the opening 232. Thus, as a copper pillar 240 descends, it makes first contact with the second layer 218 of the trace 214, not the solder resist layer 230, even if the copper pillar 240 is not precisely centered on the trace 214. This happens because the top of the second layer 218 is the highest surface on the substrate 210 in the vicinity of the copper pillar 240. The result is that the solder tip 242 of CuP 240 makes contact with second layer 218 before having any opportunity to contact the solder resist layer 230. Therefore, as shown in FIG. 7, a bond 250 between coating layer 218 and the solder tip 242 is formed that is free of any debris from the solder resist layer 230. By raising the effective contact surface of the trace 214 above the solder resist layer 230, another positive affect is also achieved. The solder resist opening 232 may be reduced in size with respect to the side of the CuP 240 since it is no longer necessary for the CuP 240 to fit into the solder resist opening 232. Thus, solder resist undercut is prevented. Also the diameters of the CuP's 240 may be increased with respect to the size of the solder resist openings. A diameter increase in the CuP makes it easier to engage each CuP with a corresponding trace. In other words, the alignment between CuP's and corresponding traces need not be as precise with the structure shown in FIGS. 6 and 7 as with the structures shown in FIGS. 3-5 because each CuP may be given a wider footprint without causing other problems. For example, as shown in FIGS. 6 and 7, CuP's 240 could be made with footprints that are wider than the corresponding solder resist openings 232. Such Cup's 240 are functionally connectable to a substrate, such as 210, that has an overall trace height $t_2$ (including coatings) in the corresponding solder resist opening 232, which is greater than the height $s_1$ of the solder resist layer 230. It will also be understood that the CuP 240 may be given a wider footprint even if its cross sectional shape is other than a circle, for example an oval or a rectangle or other geometric shape. Thus, defective assemblies may be reduced and product yield rates may be improved by structures such as shown and described in FIGS. 6 and 7.

FIG. 8 is a top plan view of a flipchip die and substrate assembly a type having cross sectional configuration which may be the same as illustrated in FIGS. 6 and 7. In this embodiment, the traces 214, 220, 222, etc., each have a first end 262, a second end 264, and an intermediate portion 266. The intermediate portions 266 of adjacent traces are staggered. The first ends 262 and the second ends 264 of adjacent traces, e.g. 214, 220, are also staggered. As a result, the first ends 262 of every other trace, e.g., 220, 222, etc., terminate at the same imaginary line AA and the first ends 264 of the other traces 214, etc., are positioned substantially inwardly of line AA. The same relationship exists with respect to the second ends 264 of the traces and an imaginary line BB. The edge of the solder resist layer 230 may lie along or outwardly of lines AA and BB. An advantage of this positioning over the prior art positioning of traces, where the traces in any array of parallel traces all begin at the same imaginary line and end at the same imaginary line, is that the total length of the traces on the substrate 210 of FIG. 8 is substantially reduced. Also, if the inwardly positioned ends 262 or 264 of adjacent traces are terminated such that there is no lengthwise overlap between them, as shown in FIG. 8, then the possibility of a short between adjacent traces is substantially reduced. (The phrase "adjacent traces" as used herein refers to traces having adjacent axes, even when the traces themselves are of lengths that are not even partially coextensive.) As a result, the lateral distance between traces may be reduced, enabling a denser design and thus use of associated CuP flipchip dies with higher pitches. Also, shorter length traces may reduce the possibility of Cu migration and certain undesirable electrical effects such as parasitic capacitance. It also enables the use of larger solder resist openings and thus enables the use of a substrate design that is easier to manufacture than those of the prior art.

Figure 9:
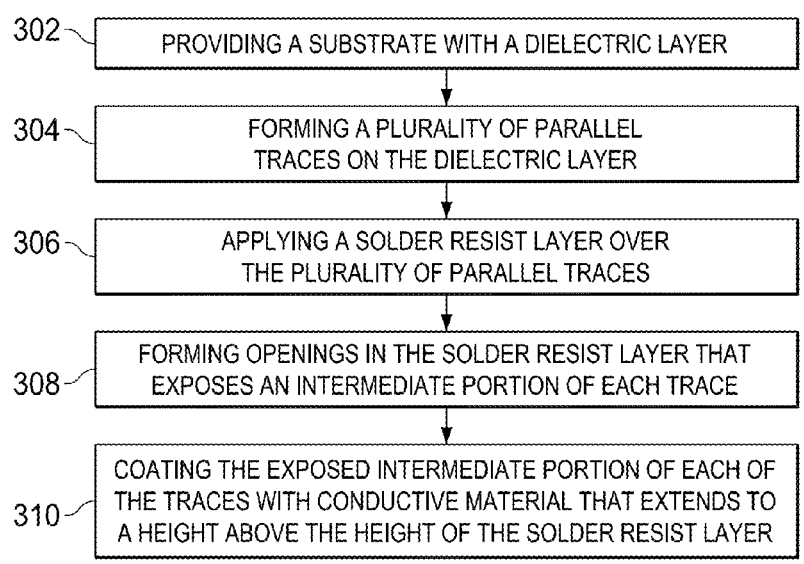
FIG. 9 is a flow chart of a method of forming a CuP attach substrate.

FIG. 9 is a block diagram of a method of forming a copper pillar attach substrate. The method includes as shown at 302, providing a substrate with a dielectric layer. The method also includes, as shown at 304, forming a plurality of parallel traces on the dielectric layer. The method further includes, as shown at 306, applying a solder resist layer over the plurality of parallel traces and includes as shown at 308, forming openings in the solder resist layer that exposes an intermediate portion of each trace. The method further includes, as shown at 310, coating the exposed intermediate portion of each of the traces with conductive material that extends to a height above the height of the solder resist layer.

While certain embodiments of a copper pillar attach substrate and associated methods have been disclosed in detail herein, various alternative embodiments thereof will become obvious to those skilled in the art after reading this disclosure. It is intended that the claims depended hereto be broadly construed to cover such alternative embodiments, except as limited by the prior art.

What is claimed is:

1. An electronic assembly comprising:
   a copper pillar attach substrate comprising:
   a dielectric layer;
   a solder resist layer overlying said dielectric layer, said solder resist layer having a plurality of openings therein and having a solder resist layer thickness; and
   a plurality of parallel traces formed on said dielectric layer, each trace having a first end portion, a second end portion and an intermediate portion, said first and second end portions being covered by said solder resist layer, said intermediate portions being positioned in said openings in said solder resist layer, each of said intermediate portions having at least one conductive coating layer thereon and having a height measured from said dielectric layer to a topmost one of said at least one conductive coating layer that is at least as great as said solder resist layer thickness.

2. The electronic assembly of claim 1, said at least one conductive coating layer comprising a first conductive coating layer and a second conductive coating layer.

3. The electronic assembly of claim 2, said first conductive coating layer comprising copper.

4. The electronic assembly of claim 2, said second conductive coating layer comprising tin.

5. The electronic assembly of claim 1, said traces comprising copper.

6. The electronic assembly of claim 1, said openings in said solder resist layer being staggered.

7. The electronic assembly of claim 1, adjacent ones of said plurality of parallel traces being separated by a trace spacing distance, said solder resist layer openings being staggered, and further comprising a die having a plurality of copper pillars, each of said copper pillars having a tip portion connected to said intermediate portion of an associated one of said plurality of traces; each of said copper pillars having a cross sectional dimension measured perpendicular to said parallel traces that is greater than a dimension of an associated one of said solder resist openings measured perpendicular to said parallel traces.

8. The electronic assembly of claim 7 said tip portion of each of said copper pillars being bonded to said at least one coating layer on said intermediate portion of an associated one of said plurality of traces.

9. The electronic assembly of claim 8, said at least one conductive coating layer on said intermediate portion of each of said plurality of traces comprising a first coating layer and second coating layer over said first coating layer, said tip portion of said copper pillar being bonded to said second coating layer.

10. The electronic assembly of claim 9, said first coating layer being thicker than said second coating layer.

11. The electronic assembly of claim 7, said tip portions each having a circular cross section.

12. The electronic assembly of claim 1 said plurality of parallel traces being positioned in an area defined by a first line perpendicular to said traces and intersecting an outermost one of said trace first end portions and a second line perpendicular to said traces and intersecting an outermost one of said trace second end portions and wherein said plurality of traces each has a length less than distance between said first line and said second line.

13. The electronic assembly of claim 12 wherein said plurality of traces each has a length less than one half the distance between said first line and said second line.

14. The electronic assembly of claim 12 wherein said layer of solder resist extends at least to said first line and to said second line in a region extending from at least a first one of said plurality of parallel traces to at least a last one of said plurality of parallel traces.

15. An electronic assembly comprising:
a copper pillar attach substrate comprising:
a dielectric layer;
a solder resist layer overlying said dielectric layer, said solder resist layer having a plurality of openings therein and having a solder resist layer thickness; and
a plurality of parallel traces formed on said dielectric layer, each trace having a first end portion, a second end portion and an intermediate portion, said first and second end portions being covered by said solder resist layer, said intermediate portions being positioned in said openings in said solder resist layer, said plurality of parallel traces being positioned in an area defined by a first line perpendicular to said traces and intersecting an outermost one of said trace first end portions and a second line perpendicular to said traces and intersecting an outermost one of said trace second end portions and wherein said plurality of traces each has a length less than the distance between said first line and said second line.

16. The electronic assembly of claim 15 wherein adjacent ones of said plurality of parallel traces have no lengthwise overlap.

17. The electronic assembly of claim 15 wherein said openings in said solder resist layer are arranged in parallel rows extending transversely to said traces.

18. A method of forming a copper pillar attach substrate comprising:
providing a substrate with a dielectric layer;
forming a plurality of parallel traces on the dielectric layer;
applying a solder resist layer over the plurality of parallel traces,
forming openings in the solder resist layer that exposes an intermediate portion of each trace; and
coating the exposed intermediate portion of each of the traces with conductive material that extends to a height above the height of the solder resist layer.

19. The method of claim 18 wherein said forming a plurality of parallel traces on the dielectric layer comprises staggering the starting points and the ending points of the parallel traces such that no portion of the lengths of adjacent parallel traces are positioned laterally opposite one another.

20. The method of claim 18 wherein said forming openings in the solder resist layer that exposes an intermediate portion of each trace comprises forming staggered openings.

* * * * *